(12) United States Patent
Kim et al.

(10) Patent No.: US 10,607,673 B2
(45) Date of Patent: *Mar. 31, 2020

(54) SEMICONDUCTOR DEVICES FOR CONTROLLING INPUT OF A DATA STROBE SIGNAL

(71) Applicant: SK hynix Inc., Icheon-si, Gyeonggi-do (KR)

(72) Inventors: Hak Song Kim, Seoul (KR); Min Su Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,425

(22) Filed: Feb. 25, 2019

(65) Prior Publication Data

US 2019/0189170 A1   Jun. 20, 2019

Related U.S. Application Data

(63) Continuation of application No. 15/687,149, filed on Aug. 25, 2017, now Pat. No. 10,262,709.

(30) Foreign Application Priority Data

Mar. 20, 2017   (KR) .......................... 10-2017-0034872

(51) Int. Cl.
| | | |
|---|---|---|
| *G11C 8/00* | (2006.01) | |
| *G11C 8/18* | (2006.01) | |
| *G11C 7/22* | (2006.01) | |
| *G11C 7/10* | (2006.01) | |
| *G11C 8/10* | (2006.01) | |

(52) U.S. Cl.
CPC ................ *G11C 8/18* (2013.01); *G11C 7/109* (2013.01); *G11C 7/1084* (2013.01); *G11C 7/1093* (2013.01); *G11C 7/222* (2013.01); *G11C 8/10* (2013.01); *G11C 2207/2272* (2013.01)

(58) Field of Classification Search
CPC .......... G11C 8/18; G11C 8/10; G11C 7/1084; G11C 7/109; G11C 7/1093; G11C 7/222; G11C 7/22; G11C 7/1096
USPC ....... 365/233.1, 233, 189.07, 189.11, 189.05
See application file for complete search history.

(56) References Cited

U.S. PATENT DOCUMENTS 10,262,709 B2 *   4/2019   Kim .................... G11C 7/109
2001/0000994 A1   5/2001   Tomita et al.
(Continued)

FOREIGN PATENT DOCUMENTS

KR   1020070027810 A   3/2007

*Primary Examiner* — Connie C Yoha
(74) *Attorney, Agent, or Firm* — William Park & Associates Ltd.

(57) ABSTRACT

A semiconductor device may be provided. The semiconductor device may include a period code generation circuit configured to generate a period code having a logic level combination corresponding to a first command or a second command. The semiconductor device may include a code synthesis circuit configured to add the period code to a previous synthesis code to generate a synthesis code. The semiconductor device may include a buffer control circuit configured to compare the synthesis code with a selection control code to generate a buffer inactivation signal for controlling input of a data strobe signal.

12 Claims, 12 Drawing Sheets

(56) References Cited

U.S. PATENT DOCUMENTS

2012/0269016 A1* 10/2012 Park ................... G11C 7/1066
                                                     365/194
2015/0049559 A1    2/2015 Song
2016/0336077 A1   11/2016 Noh
2017/0018314 A1    1/2017 Chae
2019/0325927 A1* 10/2019 Choi ................... G11C 7/1093

* cited by examiner

|  | PC<3> | PC<2> | PC<1> |
|---|---|---|---|
| CMD1="H" | H | L | L |
| CMD2="H" | H | L | H |

SEMICONDUCTOR DEVICES FOR CONTROLLING INPUT OF A DATA STROBE SIGNAL

CROSS-REFERENCE TO RELATED APPLICATIONS

The present application is a continuation application for U.S. patent application Ser. No. 15/687,149 and claims priority under 35 U.S.C 119(a) to Korean Application No. 10-2017-0034872, filed on Mar. 20, 2017, which is incorporated herein by reference in its entirety.

BACKGROUND

1. Technical Field

Embodiments of the present disclosure may generally relate to semiconductor devices including an input buffer circuit configured for receiving a data strobe signal.

2. Related Art

Recently, a plurality of input and output (input/output) (I/O) control signals generated from data strobe signals have been used for fast operation of semiconductor systems including semiconductor devices. The I/O control signals may be set to have different phases from each other and may be used in inputting and outputting of the data. For example, the semiconductor devices may generate four I/O control signals having a phase difference of 90 degrees and may receive or output the data using the four I/O control signals. In such a case, the semiconductor devices may operate at a higher speed than other semiconductor devices that input or output the data using a data strobe signal.

SUMMARY

According to an embodiment, a semiconductor device may be provided. The semiconductor device may include a period code generation circuit, a code synthesis circuit and a buffer control circuit. The period code generation circuit may be configured to generate a period code having a logic level combination corresponding to a first command or a second command. The code synthesis circuit may be configured to add the period code to a previous synthesis code to generate a synthesis code. The buffer control circuit may be configured to compare the synthesis code with a selection control code to generate a buffer inactivation signal for controlling input of a data strobe signal.

According to an embodiment, a semiconductor device may be provided. The semiconductor device may include a code selection circuit, a code synthesis circuit and a buffer control circuit. The code selection circuit may be configured to output a first control code or a second control code as a selection control code based on a synthesis code. The code synthesis circuit may be configured to add a period code having a logic level combination corresponding to a first command or a second command to a previous synthesis code to generate a synthesis code. The buffer control circuit may be configured to compare the synthesis code with the selection control code to generate a buffer inactivation signal for controlling input of a data strobe signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices controlling the input of a data strobe signal.

For reference, an embodiment including additional components may be provided. Furthermore, an active high or active low configuration indicating an active state of a signal or circuit may be changed depending on embodiments. Further, the logic levels of the signals may be different from or the opposite of those described. For example, a signal described as having a logic "high" level may alternatively have a logic "low" level, and a signal described as having a logic "low" level may alternatively have a logic "high" level. Also, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
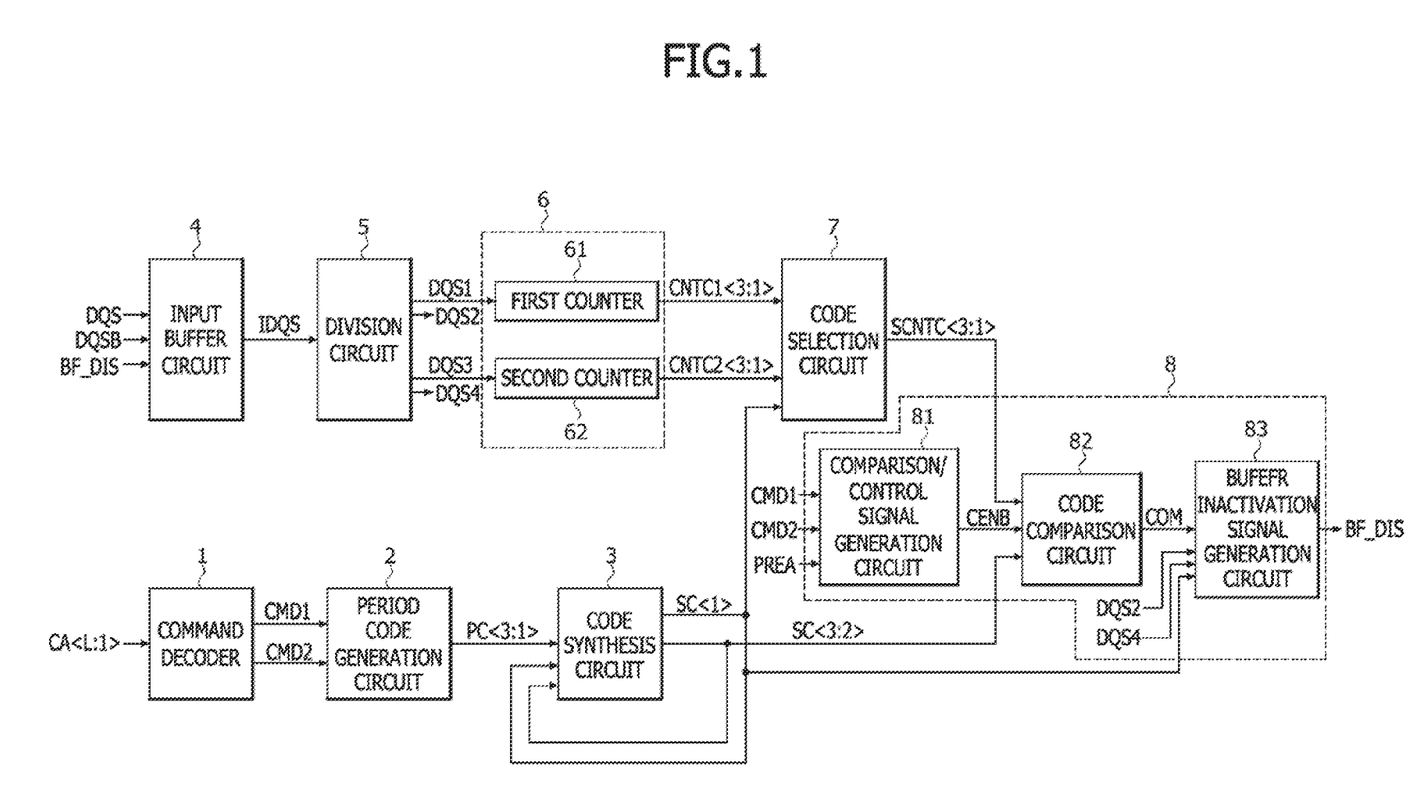
FIG. 1 is a block diagram illustrating a configuration of a semiconductor device according to an embodiment of the present disclosure.

Referring to FIG. 1, a semiconductor device according to an embodiment may include a command decoder 1, a period code generation circuit 2, a code synthesis circuit 3, an input buffer circuit 4, a division circuit 5, a control code generation circuit 6, a code selection circuit 7 and a buffer control circuit 8.

The command decoder 1 may generate a first command CMD1 and a second command CMD2 in response to an external control signal CA<L:1>. The command decoder 1 may decode the external control signal CA<L:1> to generate the first command CMD1 and the second command CMD2. The external control signal CA<L:1> may include at least one of a command and an address. The command and the address included in the external control signal CA<L:1> may be transmitted through the same signal line or may be transmitted through two separate signal lines. The number "L" of bits included in the external control signal CA<L:1> may be set to be different according to the embodiments. The first command CMD1 may be enabled to perform a first write operation. The first write operation may be defined as a write operation that is performed without a preamble period. The second command CMD2 may be enabled to perform a second write operation. The second write operation may be defined as a write operation that is performed with a preamble period.

The period code generation circuit 2 may generate a period code PC<3:1> including three bits in response to the first and second commands CMD1 and CMD2. The period code generation circuit 2 may generate the period code PC<3:1> having a first logic level combination in response to the first command CMD1 which is enabled to perform the first write operation. The period code generation circuit 2 may generate the period code PC<3:1> having a second logic level combination in response to the second command CMD2 which is enabled to perform the second write operation. The first and second logic level combinations of the period code PC<3:1> may be set to be different according to the embodiments. Logic level combinations of the period code PC<3:1> generated by the period code generation circuit 2 during the first and second write operations will be described with reference to FIG. 2 later.

The code synthesis circuit 3 may generate a synthesis code SC<3:1> including three bits in response to the period code PC<3:1> and the synthesis code SC<3:1>, The code synthesis circuit 3 may add the period code PC<3:1> to the synthesis code SC<3:1> to generate the synthesis code SC<3:1>. In an embodiment, for example, the code synthesis circuit 3 may be configured to add the period code PC<3:1> to a previous synthesis code SC<3:1> to generate a synthesis code SC<3:1>. For example, if the synthesis code SC<3:1> has a logic level combination of '101' and the period code PC<3:1> has a logic level combination of '100', the logic level combination of '101' and the logic level combination of '100' may be added to each other to generate the synthesis code SC<3:1> having a logic level combination of '001'. In the synthesis code SC<3:1>, the logic level combination of '101' means that the third synthesis code SC<3> has a logic "high" level, the second synthesis code SC<2> has a logic "low" level, and the first synthesis code SC<1> has a logic "high" level. In the period code PC<3:1>, the logic level combination of '100' means that the third period code PC<3> has a logic "high" level, the second period code PC<2> has a logic "low" level, and the first period code PC<1> has a logic "low" level. A configuration and an operation of the code synthesis circuit 3 will be described with reference to FIG. 3 later.

The input buffer circuit 4 may generate an internal data strobe signal IDQS from a data strobe signal DQS and an inverted data strobe signal DQSB in response to a buffer inactivation signal BF_DIS. The input buffer circuit 4 may amplify a level difference between the data strobe signal DQS and the inverted data strobe signal DQSB to generate the internal data strobe signal IDQS. The input buffer circuit 4 may terminate generation of the internal data strobe signal IDQS if the buffer inactivation signal BF_DIS is enabled. A configuration and an operation of the input buffer circuit 4 will be described with reference to FIG. 4 later.

The division circuit 5 may generate first to fourth input and output (input/output) (I/O) control signals DQS1, DQS2, DQS3 and DQS4 in response to the internal data strobe signal IDQS. The division circuit 5 may divide the internal data strobe signal IDQS to generate the first to fourth I/O control signals DQS1, DQS2, DQS3 and DQS4. A cycle time of the first to fourth I/O control signals DQS1, DQS2, DQS3 and DQS4 may be set to be twice a cycle time of the internal data strobe signal IDQS. A phase of the first I/O control signal DQS1 may be set to precede a phase of the second I/O control signal DQS2 by 90 degrees, a phase of the second I/O control signal DQS2 may be set to precede a phase of the third I/O control signal DQS3 by 90 degrees, and a phase of the third I/O control signal DQS3 may be set to precede a phase of the fourth I/O control signal DQS4 by 90 degrees. Phases of the first to fourth I/O control signals DQS1, DQS2, DQS3 and DQS4 may be set to be different according to the embodiments.

The control code generation circuit 6 may include a first counter 61 and a second counter 62. The first counter 61 may generate a first control code CNTC1<3:1> in response to the first I/O control signal DQS1. The first counter 61 may output the first control code CNTC1<3:1> that is counted if the first I/O control signal DQS1 is toggled. Whenever the first control code CNTC1<3:1> is counted, a logic level combination of the first control code CNTC1<3:1> may increase bit by bit. For example, if the first control code CNTC1<3:1> having a logic level combination of '101' is counted once, the first control code CNTC1<3:1> may be set to have a logic level combination of '110'. The second counter 62 may generate a second control code CNTC2<3:1> in response to the third I/O control signal DQS3. The second counter 62 may output the second control code CNTC2<3:1> that is counted if the third I/O control signal DQS3 is toggled. Whenever the second control code CNTC2<3:1> is counted, a logic level combination of the second control code CNTC2<3:1> may increase bit by bit.

The code selection circuit 7 may generate a selection control code SCNTC<3:1> from the first control code CNTC1<3:1> and the second control codes CNTC2<3:1> in response to the first synthesis code SC<1>. The code selection circuit 7 may select and output the first control code CNTC1<3:1> as the selection control code SCNTC<3:1> if the first synthesis code SC<1> has a first logic level. The code selection circuit 7 may select and output the second control code CNTC2<3:1> as the selection control code SCNTC<3:1> if the first synthesis code SC<1> has a second logic level. The first logic level and the second logic level of the first synthesis code SC<1> may be set to be different according to the embodiments. A configuration and an operation of the code selection circuit 7 will be described with reference to FIG. 5 later.

The buffer control circuit 8 may include a comparison/control signal generation circuit 81, a code comparison circuit 82 and a buffer inactivation signal generation circuit 83.

The comparison/control signal generation circuit 81 may generate a comparison/control signal CENB in response to a preamble signal PREA, the first command CMD1 and the second command CMD2. The preamble signal PREA may have a logic level for selecting a pre-latency period if the first write operation or the second write operation is performed. The comparison/control signal generation circuit 81 may generate the comparison/control signal CENB having a level that changes at a point of time that is set according to latency information if the first write operation is performed by the first command CMD1 or the second write operation is performed by the second command CMD2. In some embodiments, the first write operation may be successively performed twice, and the second write operation may also be successively performed twice. For example, in the event that the first write operation is successively performed twice, the comparison/control signal generation circuit 81 may generate the comparison/control signal CENB with a level that changes at a point time that the first write operation is performed secondly. In some other embodiments, the first write operation and the second write operation may be sequentially performed. In the event that the first write operation and the second write operation are sequentially performed, the comparison/control signal generation circuit 81 may generate the comparison/control signal CENB having a level that changes at a point time that the second write operation is performed. A configuration and an operation of the comparison/control signal generation circuit 81 will be described with reference to FIGS. 6 and 7 later.

The code comparison circuit 82 may compare the selection control code SCNTC<3:1> with the second and third synthesis codes SC<3:2> to generate a comparison signal COM, in response to the comparison/control signal CENB. The code comparison circuit 82 may compare two bits selected from the selection control code SCNTC<3:1> with the second and third synthesis codes SC<3:2> to generate the comparison signal COM, while the comparison/control signal CENB has a predetermined logic level. For example, the code comparison circuit 82 may generate the comparison signal COM which is enabled if the first and second selection control codes SCNTC<2:1> have the same logic level combination as the second and third synthesis codes SC<3:2>. A logic level of the comparison signal COM which is enabled may be set to be different according to the embodiments. A configuration and an operation of the code comparison circuit 82 will be described with reference to FIG. 8 later.

The buffer inactivation signal generation circuit 83 may generate the buffer inactivation signal BF_DIS in response to the comparison signal COM, the second I/O control signal DQS2, the fourth I/O control signal DQS4 and the first synthesis code SC<1>. The buffer inactivation signal generation circuit 83 may latch the comparison signal COM in synchronization with the second I/O control signal DQS2 or the fourth I/O control signal DQS4 according to a logic level of the first synthesis code SC<1> to output the latched comparison signal as the buffer inactivation signal BF_DIS. The buffer inactivation signal generation circuit 83 may latch the comparison signal COM in synchronization with the fourth I/O control signal DQS4 to output the latched comparison signal as the buffer inactivation signal BF_DIS, if the first synthesis code SC<1> has a first logic level. The buffer inactivation signal generation circuit 83 may latch the comparison signal COM in synchronization with the second I/O control signal DQS2 to output the latched comparison signal as the buffer inactivation signal BF_DIS, if the first synthesis code SC<1> has a second logic level. The first logic level and the second logic level of the first synthesis code SC<1> may be set to be different according to the embodiments. A configuration and an operation of the buffer inactivation signal generation circuit 83 will be described with reference to FIG. 9 later.

Figure 2:
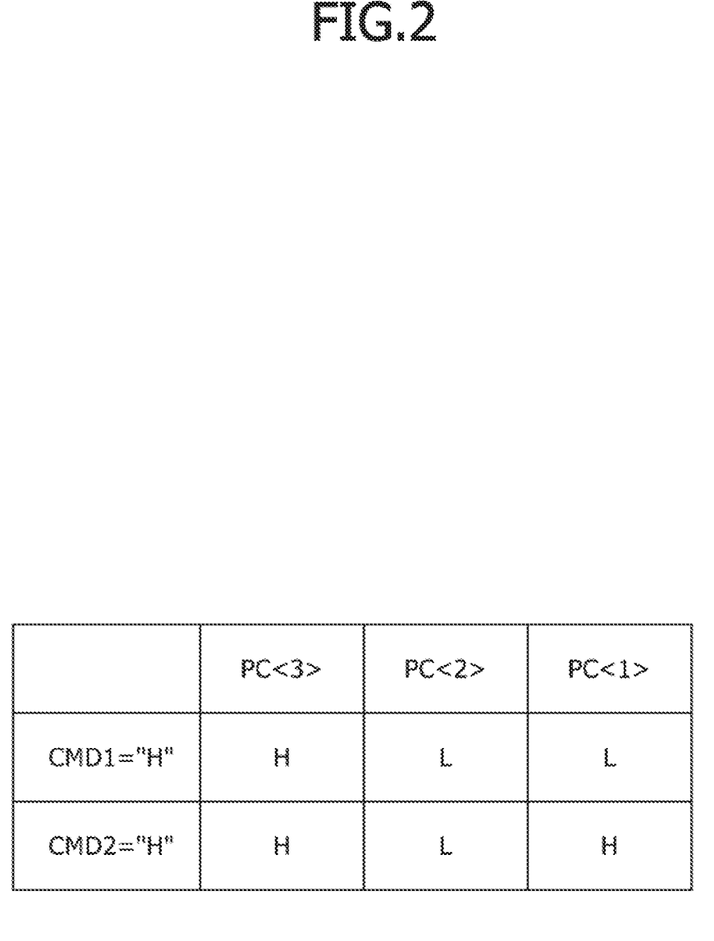
FIG. 2 is a table illustrating logic level combinations of a period code generated according to operations performed by commands.

Referring to FIG. 2, logic level combinations of the period code PC<3:1>, which are set during the first and second write operations, are listed. The period code PC<3:1> may be set to have a logic level combination of '100' by the first command CMD1 which is enabled to have a logic "high" level while the first write operation is performed. In the period code PC<3:1>, the logic level combination of '100' means that the third period code PC<3> has a logic "high" level, the second period code PC<2> has a logic "low" level, and the first period code PC<1> has a logic "low" level. The period code PC<3:1> may be set to have a logic level combination of '101' by the second command CMD2 which is enabled to have a logic "high" level while the second write operation is performed. In the period code PC<3:1>, the logic level combination of '101' means that the third period code PC<3> has a logic "high" level, the second period code PC<2> has a logic "low" level, and the first period code PC<1> has a logic "high" level.

Figure 3:
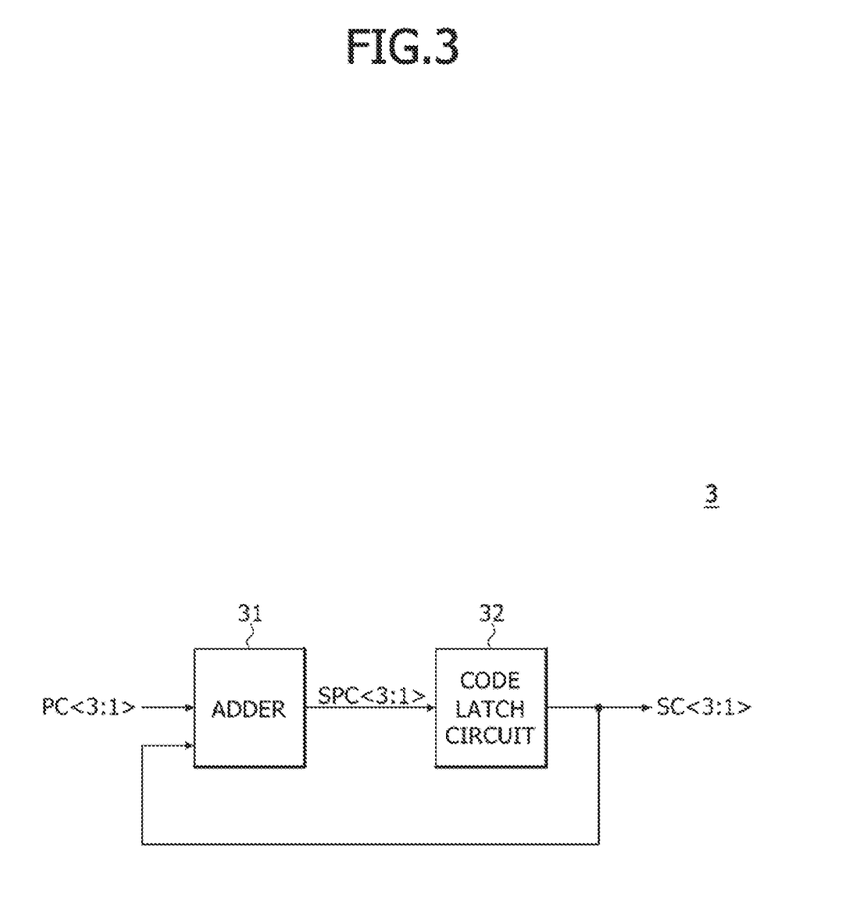
FIG. 3 is a block diagram illustrating a configuration of an example of a code synthesis circuit included in the semiconductor device of FIG. 1.

Referring to FIG. 3, the code synthesis circuit 3 may include an adder 31 and a code latch circuit 32.

The adder 31 may generate a synthesis period code SPC<3:1> including three bits in response to the period code PC<3:1> and the synthesis code SC<3:1>. For example, if the synthesis code SC<3:1> has a logic level combination of '101' and the period code PC<3:1> has a logic level combination of '100', the synthesis period code SPC<3:1> may be generated to have a logic level combination of '001' corresponding to a sum of the logic level combination of '101' and the logic level combination of '100'.

The code latch circuit 32 may latch and store the synthesis period code SPC<3:1>. The code latch circuit 32 may output the stored synthesis period code as the synthesis code SC<3:1>.

Figure 4:
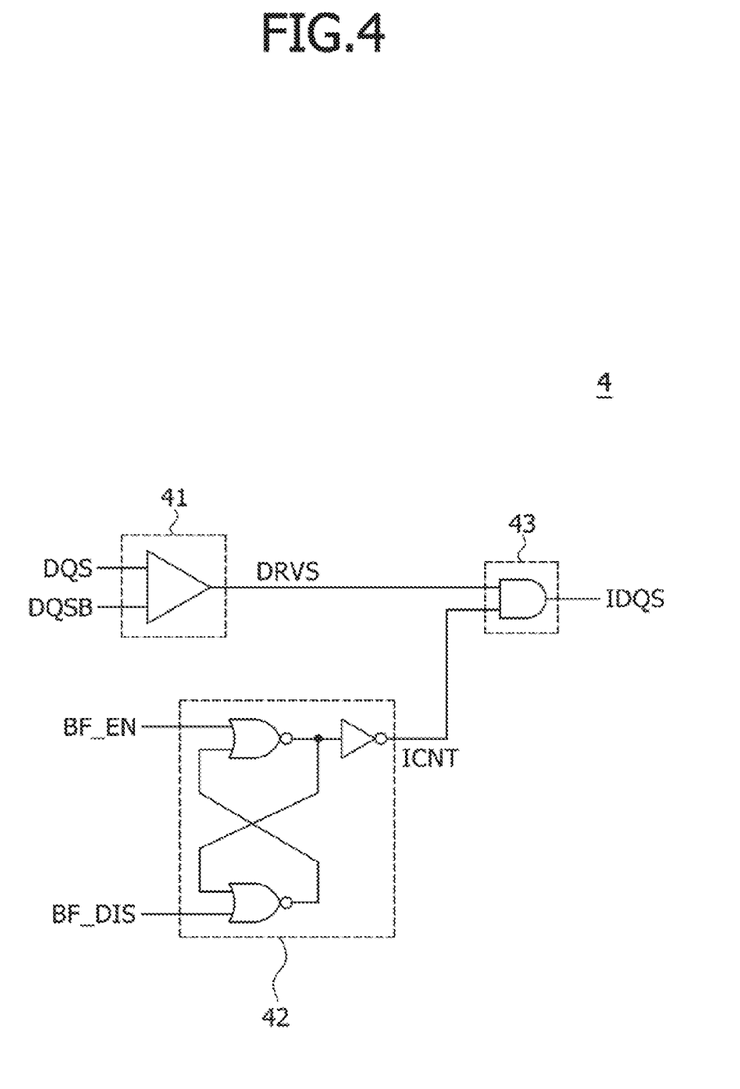
FIG. 4 is a circuit diagram illustrating an example of an input buffer circuit included in the semiconductor device of FIG. 1.

Referring to FIG. 4, the input buffer circuit 4 may include an input driver 41, an internal control circuit 42 and a signal output unit 43.

The input driver 41 may generate a drive signal DRVS in response to the data strobe signal DQS and the inverted data strobe signal DQSB. The input driver 41 may amplify a level difference between the data strobe signal DQS and the inverted data strobe signal DQSB to generate the drive signal DRVS. The input driver 41 may be realized using, for example but not limited to, a differential amplification circuit.

The internal control circuit 42 may generate an internal control signal ICNT in response to a buffer activation signal BF_EN and the buffer inactivation signal BF_DIS. The internal control circuit 42 may generate the internal control signal ICNT which is enabled to have a logic "high" level if the buffer activation signal BF_EN is enabled to have a logic "high" level. The internal control circuit 42 may generate the internal control signal ICNT which is disabled to have a logic "low" level if the buffer inactivation signal BF_DIS is enabled to have a logic "high" level. The buffer activation signal BF_EN may be generated by an internal circuit included in the semiconductor device or may be provided by an external device, according to the embodiments. The internal control circuit may be realized using, for example but not limited to, an SR latch and an inversion logic gate, for example, but not limited to, a NOR gate S-R latch and in inverter.

The signal output unit 43 may generate the internal data strobe signal IDQS in response to the drive signal DRVS and the internal control signal ICNT. The signal output unit 43 may buffer the drive signal DRVS to output the buffered drive signal as the internal data strobe signal IDQS while the internal control signal ICNT is enabled to have a logic "high" level. The signal output unit 43 may be realized using, for example but not limited to, an AND operator, for example, but not limited to, an AND gate.

Figure 5:
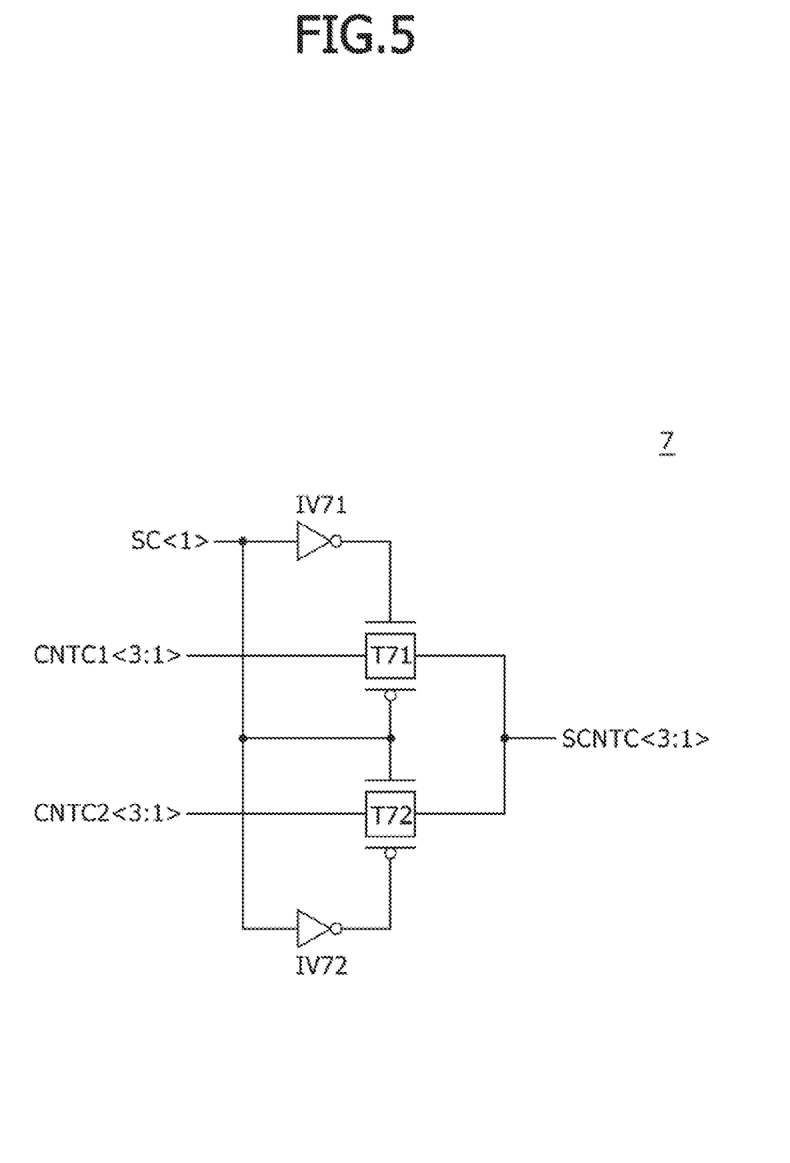
FIG. 5 is a circuit diagram illustrating an example of a code selection circuit included in the semiconductor device of FIG. 1.

Referring to FIG. 5, the code selection circuit 7 may include inverters IV71 and IV72 and transfer gates T71 and T72. The transfer gate T71 may be turned on to output the first control code CNTC1<3:1> as the selection control code SCNTC<3:1> if the first synthesis code SC<1> has a logic "low" level. The transfer gate T72 may be turned on to output the second control code CNTC2<3:1> as the selection control code SCNTC<3:1> if the first synthesis code SC<1> has a logic "high" level.

Figure 6:
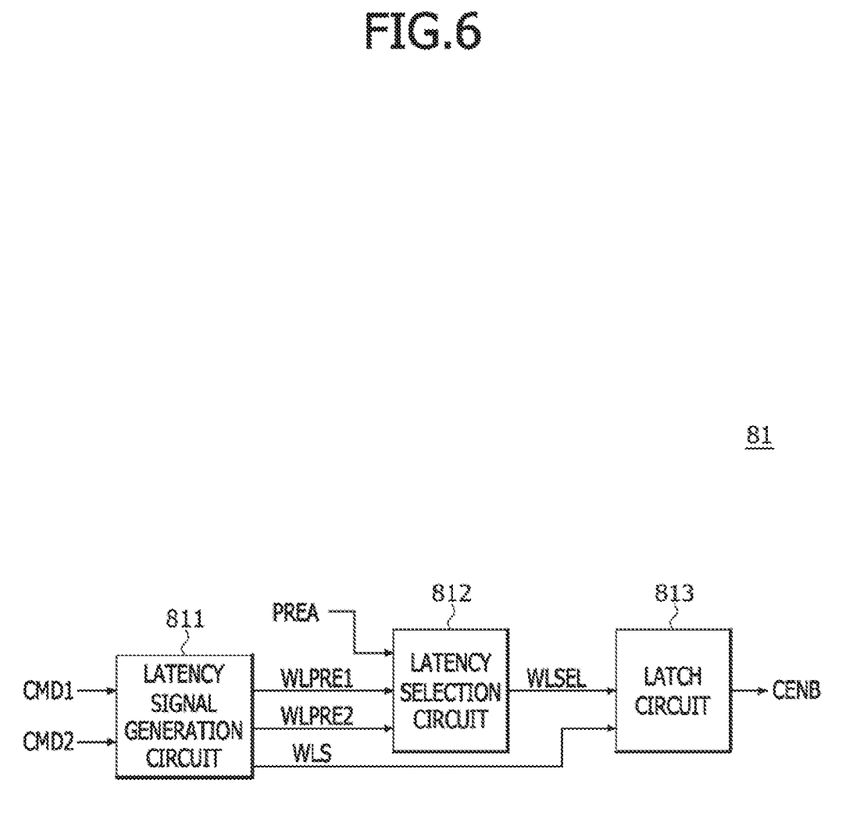
FIG. 6 is a block diagram illustrating a configuration of an example of a comparison and control (comparison/control) signal generation circuit included in the semiconductor device of FIG. 1.

Referring to FIG. 6, the comparison/control signal generation circuit 81 may include a latency signal generation circuit 811, a latency selection circuit 812 and a latch circuit 813.

The latency signal generation circuit 811 may generate a first pre-latency signal WLPRE1, a second pre-latency signal WLPRE2 and a latency signal WLS in response to the first command CMD1 and the second command CMD2.

The latency signal generation circuit 811 may generate the first pre-latency signal WLPRE1, the second pre-latency signal WLPRE2 and the latency signal WLS, if the first write operation is performed by the first command CMD1. The first pre-latency signal WLPRE1 may be enabled during a certain period before a point of time that the first write operation is performed. For example, the first pre-latency signal WLPRE1 may be enabled from a point time that is earlier than a starting point of time of the first write operation by six cycles of the data strobe signal DQS till a point time that is earlier than the starting point of time of the first write operation by two cycles of the data strobe signal DQS. The second pre-latency signal WLPRE2 may be enabled during a certain period before a point of time that the first write operation is performed. For example, the second pre-latency signal WLPRE2 may be enabled from a point time that is earlier than a starting point of time of the first write operation by five cycles of the data strobe signal DQS till a point time that is earlier than the starting point of time of the first write operation by one cycle of the data strobe signal DQS. The latency signal WLS may be generated at a point of time that the first write operation is performed.

The latency signal generation circuit 811 may generate the first pre-latency signal WLPRE1, the second pre-latency signal WLPRE2 and the latency signal WLS, if the second write operation is performed by the second command CMD2. The first pre-latency signal WLPRE1 may be enabled during a certain period before a point of time that the second write operation is performed. For example, the first pre-latency signal WLPRE1 may be enabled from a point time that is earlier than a starting point of time of the second write operation by six cycles of the data strobe signal DQS till a point time that is earlier than the starting point of time of the second write operation by two cycles of the data strobe signal DQS. The second pre-latency signal WLPRE2 may be enabled during a certain period before a point of time that the second write operation is performed. For example, the second pre-latency signal WLPRE2 may be enabled from a point time that is earlier than a starting point of time of the second write operation by five cycles of the data strobe signal DQS till a point time that is earlier than the starting point of time of the second write operation by one cycle of the data strobe signal DQS. The latency signal WLS may be generated at a point of time that the second write operation is performed.

The latency selection circuit 812 may generate a selection latency signal WLSEL from the first and second pre-latency signals WLPRE1 and WLPRE2 in response to the preamble signal PREA. The latency selection circuit 812 may output the first pre-latency signal WLPRE1 or the second pre-latency signal WLPRE2 as the selection latency signal WLSEL according to a logic level of the preamble signal PREA. The latency selection circuit 812 may output the first pre-latency signal WLPRE1 as the selection latency signal WLSEL if the preamble signal PREA has a first logic level. The latency selection circuit 812 may output the second pre-latency signal WLPRE2 as the selection latency signal WLSEL if the preamble signal PREA has a second logic level. The first and second logic levels of the preamble signal PREA may be set to be different according to the embodiments.

The latch circuit 813 may generate the comparison/control signal CENB in response to the selection latency signal WLSEL and the latency signal WLS. The latch circuit 813 may latch the selection latency signal WLSEL to output the latched signal as the comparison/control signal CENB, in response to the latency signal WLS. The latch circuit 813 may latch the selection latency signal WLSEL to output the latched signal as the comparison/control signal CENB at a point of time that the latency signal WLS is generated.

Figure 7:
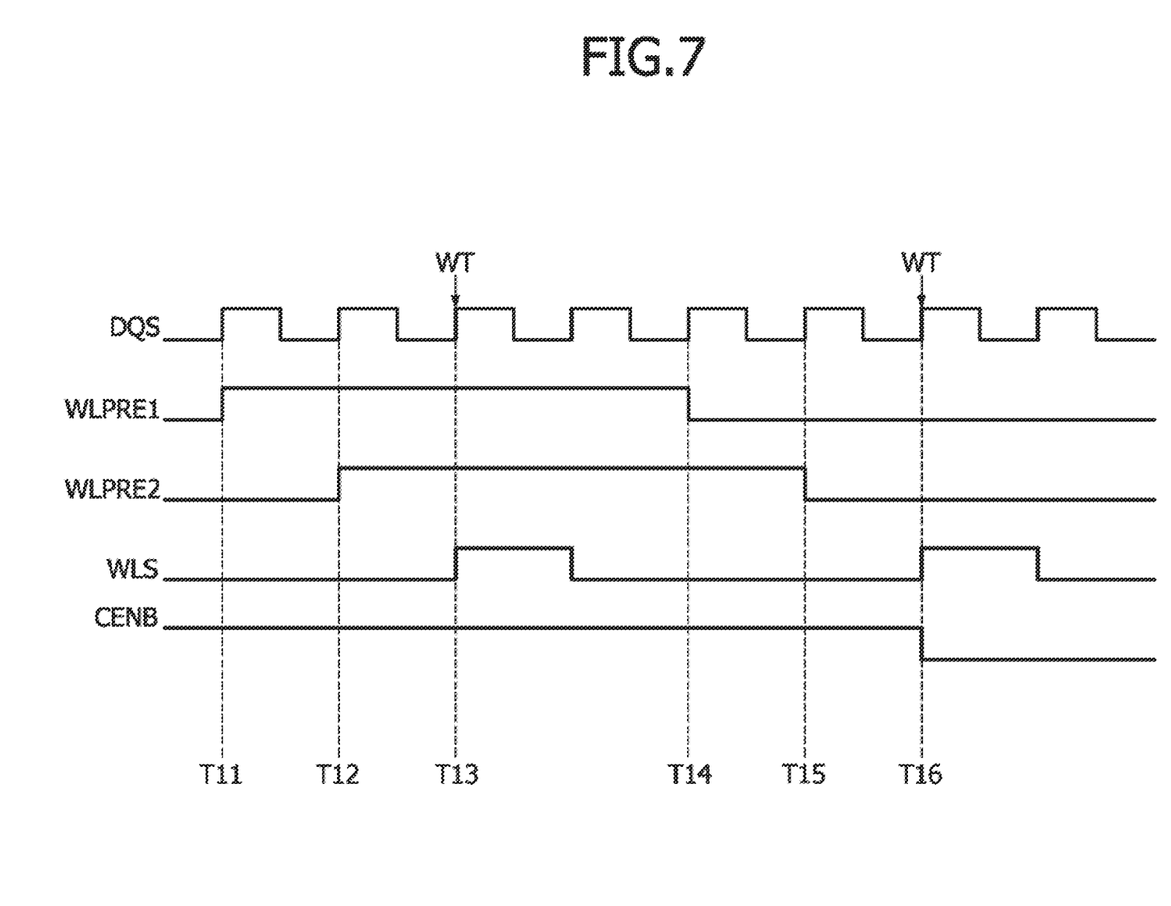
FIG. 7 is a timing diagram illustrating an operation of the comparison/control signal generation circuit illustrated in FIG. 6.

Referring to FIG. 7, when a write operation WT is performed at a point of time "T13" and at a point of time "T16", the comparison/control signal generation circuit 81 may operate as follows. The first pre-latency signal WLPRE1 may be enabled to have a logic "high" level during a period from a point of time "T11" till a point of time "T14" by the write operation WT performed at the point of time "T16", and the second pre-latency signal WLPRE2 may be enabled to have a logic "high" level during a period from a point of time "T12" till a point of time "T15" by the write operation WT performed at the point of time "T16". The latency signal WLS may be generated in synchronization with the points of time "T13" and "t16" that the write operation WT is performed. Thus, the comparison/control signal CENB may have a logic "high" level by the first pre-latency signal WLPRE1 or the second pre-latency signal WLPRE2 having a logic "high" level at the point of time "T14". In addition, the comparison/control signal CENB may have a logic "low" level by the first pre-latency signal WLPRE1 or the second pre-latency signal WLPRE2 having a logic "low" level at the point of time "T16". Referring to FIG. 7, a data strobe signal DQS and latency signal WLS are also illustrated.

Figure 8:
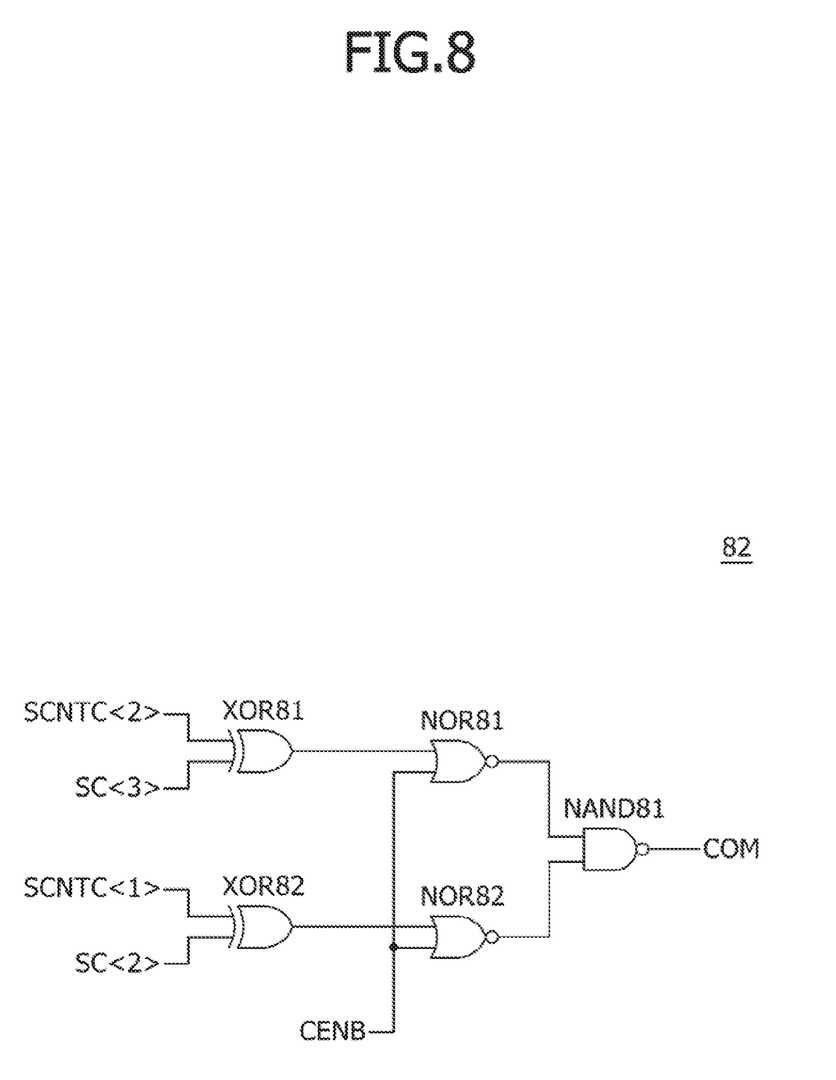
FIG. 8 is a circuit diagram illustrating an example of a code comparison circuit included in the semiconductor device of FIG. 1.

Referring to FIG. 8, the code comparison circuit 82 may include exclusive OR operators, NOR operators, and NAND operators. In an embodiment, the code comparison circuit 82 may include, for example but not limited to, exclusive OR gates XOR81 and XOR82, NOR gates NOR81 and NOR82, and a NAND gate NAND81. The code comparison circuit 82 may generate the comparison signal COM having a logic "low" level if a logic level combination of the first and second selection control codes SCNTC<2:1> is identical to a logic level combination of the second and third synthesis codes SC<3:2> while the comparison/control signal CENB has a logic "low" level. The code comparison circuit 82 may generate the comparison signal COM having a logic "high" level if a logic level combination of the first and second selection control codes SCNTC<2:1> is different from a logic level combination of the second and third synthesis codes SC<3:2> while the comparison/control signal CENB has a logic "low" level.

Figure 9:
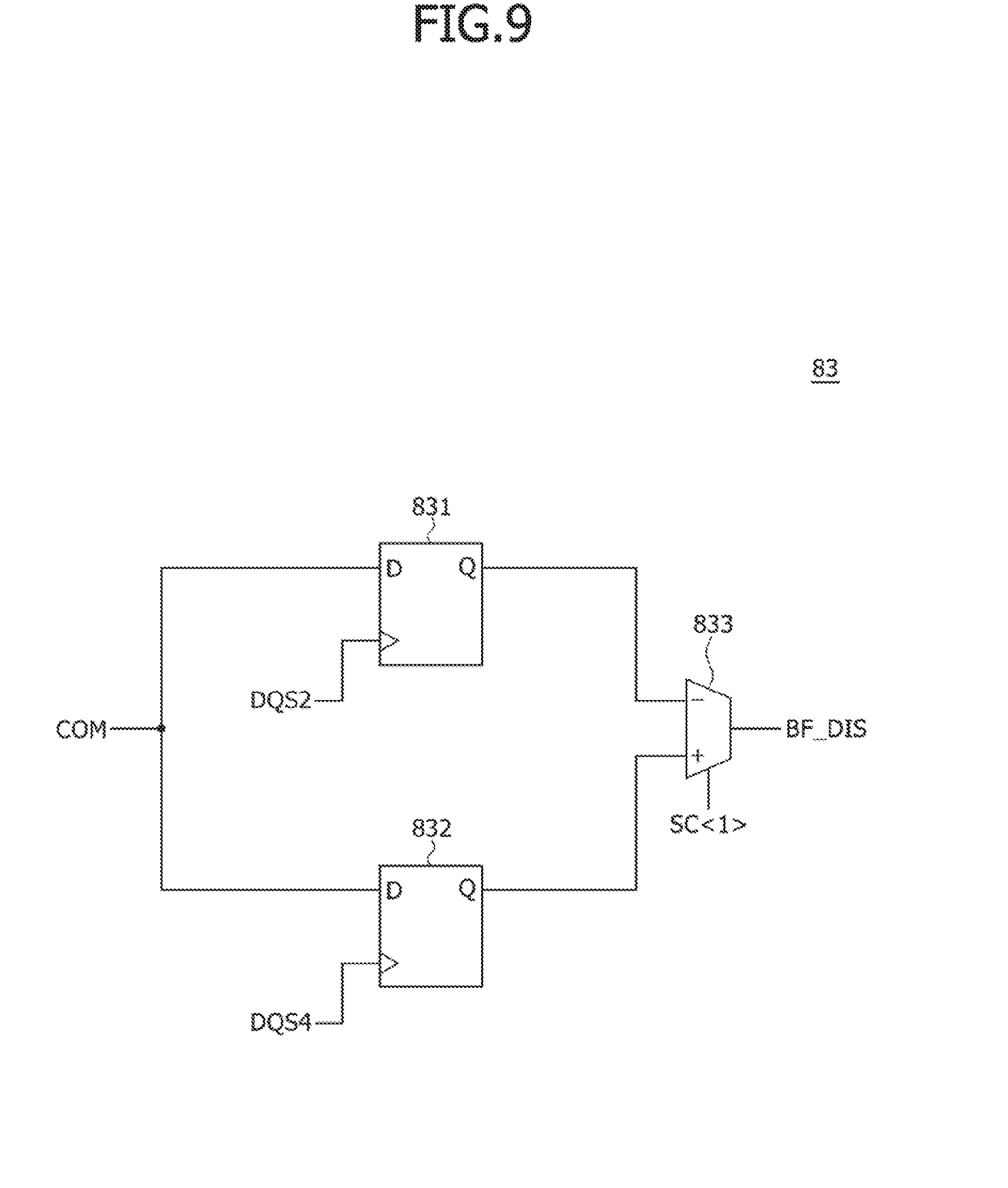
FIG. 9 is a circuit diagram illustrating an example of a buffer inactivation signal generation circuit included in the semiconductor device of FIG. 1.

Referring to FIG. 9, the buffer inactivation signal generation circuit 83 may include a first latch 831, a second latch 832 and a selector 833. The first latch 831 may latch and output the comparison signal COM in synchronization with the second I/O control signal DQS2. The second latch 832 may latch and output the comparison signal COM in synchronization with the fourth I/O control signal DQS4. The selector 833 may output an output signal of the first latch 831 as the buffer inactivation signal BF_DIS if the first synthesis code SC<1> has a logic "low" level. The selector 833 may output an output signal of the second latch 832 as the buffer inactivation signal BF_DIS if the first synthesis code SC<1> has a logic "high" level.

An operation of the semiconductor device having an aforementioned configuration will be described hereinafter with reference to FIGS. 10 and 11 in conjunction with an example in which a write operation with a preamble period and a write operation without a preamble period are sequentially performed and an example in which a write operation with a preamble period is successively performed twice.

Figure 10:
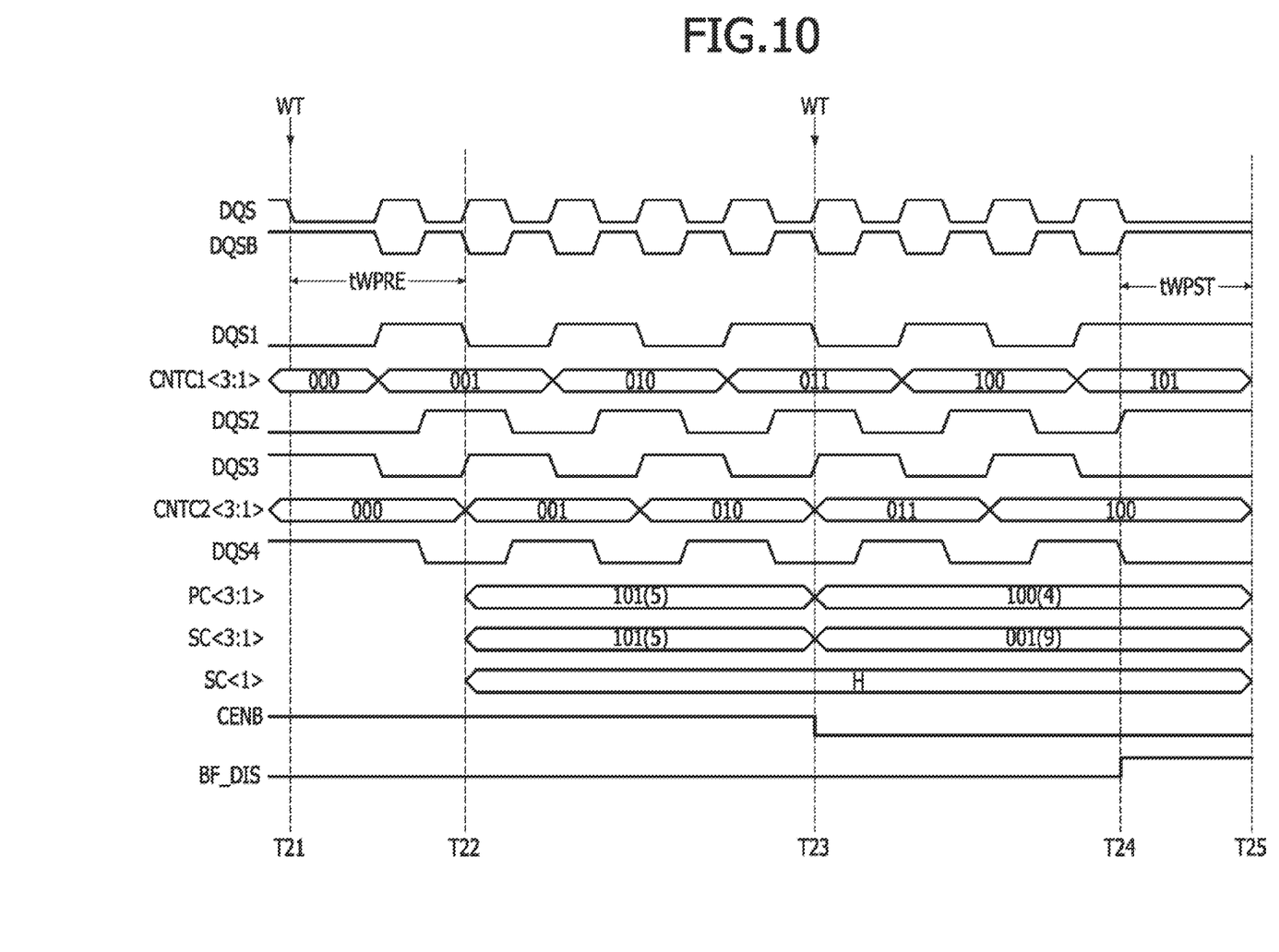
FIGS. 10 and 11 are timing diagrams illustrating an operation of the semiconductor device illustrated in FIGS. 1 to 9.

Referring to FIG. 10, if a write operation including a preamble period tWPRE is performed at a point of time "T21", the period code PC<3:1> and the synthesis code SC<3:1> may be set to have a logic level combination of '101' from a point of time "T22" that the preamble period tWPRE elapses from the point of time "T21". The logic level combination of '101', that is, a binary number '101' may correspond to a decimal number of '5'. If a write operation excluding the preamble period tWPRE is performed at a point of time "T23", the period code PC<3:1> may be set to have a logic level combination of '100' and the synthesis code SC<3:1> may be generated by adding the previous synthesis code SC<3:1> having a logic level combination of '101' to the period code PC<3:1> having a logic level combination of '100'. Accordingly, the synthesis code SC<3:1> may be generated to have a logic level combination of '001'. The logic level combination of '100', that is, a binary number '100' may correspond to a decimal number of '4', and the logic level combination of '001', that is, a binary number '001' may correspond to a decimal number of '1' or '9'. If the second control code CNTC2<3:1> toggling in synchronization with the third I/O control signal DQS3 is set to have a logic level combination of '100' while the first synthesis code SC<1> has a logic "high" level (H), the first and second selection control codes SCNTC<2:1> may have a logic level combination of '00'. Thus, since the first and second selection control codes SCNTC<2:1> have the same logic level combination as the second and third synthesis codes SC<3:2>, the comparison signal COM may be generated to have a logic "high" level. At a point of time "T24" that a level of the second I/O control signal DQS2 changes from a logic "low" level into a logic "high" level after the second control code CNTC2<3:1> is set to have a logic level combination of '100', the comparison signal COM may be buffered and the buffered comparison signal may be outputted as the buffer inactivation signal BF_DIS. At the point of time "T24" that the buffer inactivation signal BF_DIS is enabled to have a logic "high" level, an operation of the input buffer circuit 4 for generating the internal data strobe signal IDQS may be terminated. A period from the point of time "T24" till a point of time "T25" may be set as a post-amble period tWPST. Referring to FIG. 10, a data strobe signal DQS, inverted data strobe signal DQSB, a first I/O control signal DQS1, a first control code CNTC1<3:1>, a fourth I/O control signal DQS4, and comparison/control signal CENB are also illustrated.

Figure 11:
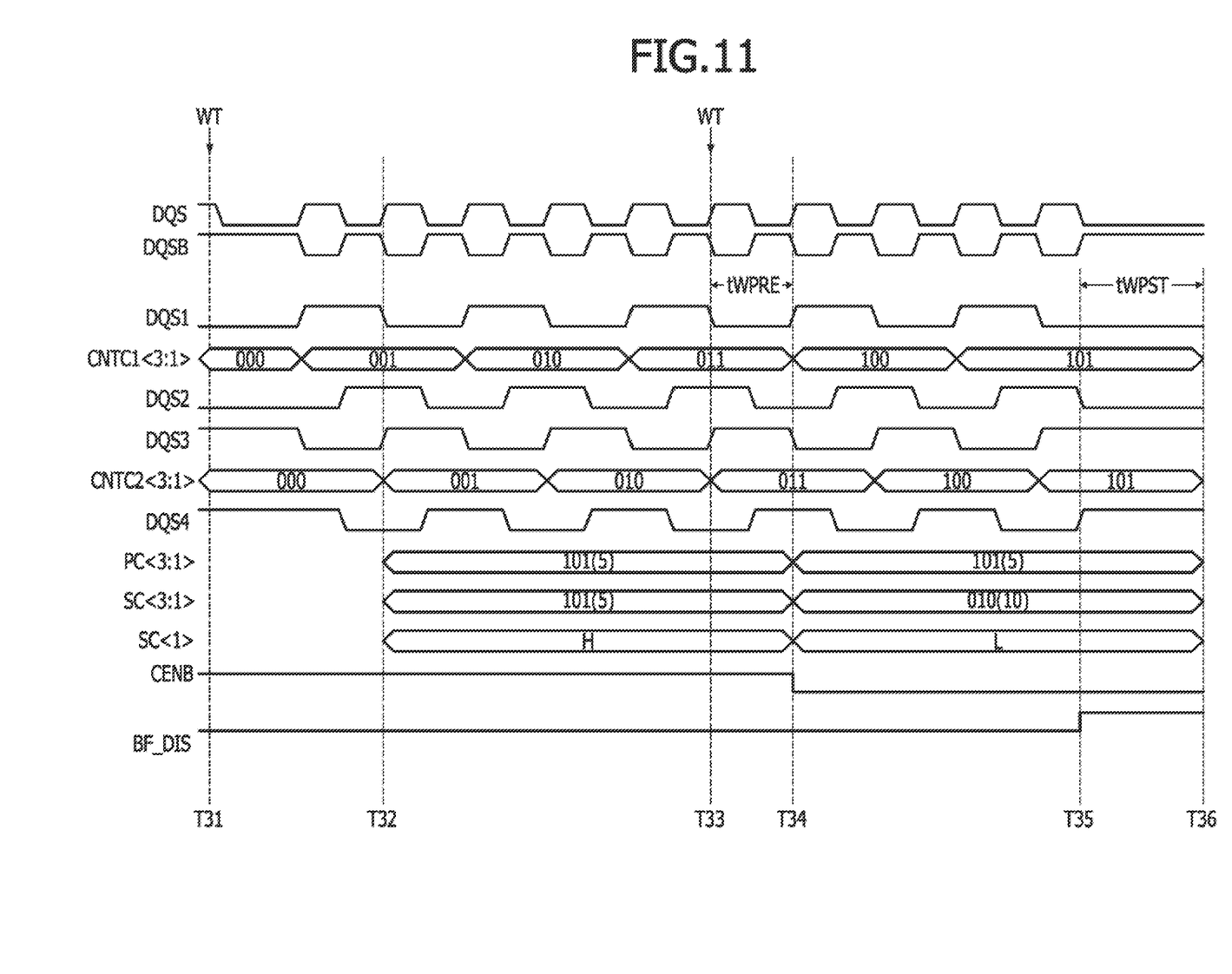

Referring to FIG. 11, if a write operation including the preamble period tWPRE is performed at a point of time "T31", the period code PC<3:1> and the synthesis code SC<3:1> may be set to have a logic level combination of '101' from a point of time "T32" that the preamble period tWPRE elapses from the point of time "T31". If the write operation including the preamble period tWPRE is performed again at a point of time "T33", the period code PC<3:1> may be set to have a logic level combination of '101' from a point of time "T34" that the preamble period tWPRE elapses from the point of time "T33" and the synthesis code SC<3:1> may be generated by adding the previous synthesis code SC<3:1> having a logic level combination of '101' to the period code PC<3:1> having a logic level combination of '101' from the point of time "T34". Accordingly, the synthesis code SC<3:1> may be generated to have a logic level combination of '010' from the point of time "34". The logic level combination of '010', that is, a binary number '010' may correspond to a decimal number of '2' or '10'. If the first control code CNTC1<3:1> toggling in synchronization with the first I/O control signal DQS1 is set to have a logic level combination of '101' while the first synthesis code SC<1> has a logic "low" level (L), the first and second selection control codes SCNTC<2:1> may have a logic level combination of '01'. Thus, since the first and second selection control codes SCNTC<2:1> have the same logic level combination as the second and third synthesis codes SC<3:2>, the comparison signal COM may be generated to have a logic "high" level. At a point of time "T35" that a level of the fourth I/O control signal DQS4 changes from a logic "low" level into a logic "high" level after the second control code CNTC2<3:1> is set to have a logic level combination of '101', the comparison signal COM may be buffered and the buffered comparison signal may be outputted as the buffer inactivation signal BF_DIS. At the point of time "T35" that the buffer inactivation signal BF_DIS is enabled to have a logic "high" level, an operation of the input buffer circuit 4 for generating the internal data strobe signal IDQS may be terminated. A period from the point of time "T35" till a point of time "T36" may be set as the post-amble period tWPST. Referring to FIG. 11, a data strobe signal DQS, inverted data strobe signal DQSB, a second and third I/O control signals DQS2 and DQS3, and comparison/control signal CENB are also illustrated.

As described above, a semiconductor device according to an embodiment may adjust the input of a data strobe signal according to a write operation to stably control an operation of an input buffer circuit. The semiconductor device may adjust the input of the data strobe signal according to a write operation performed with a preamble period and another write operation performed without the preamble period. In such a case, the data strobe signal may be inputted to the semiconductor device with a stable preamble period.

Figure 12:
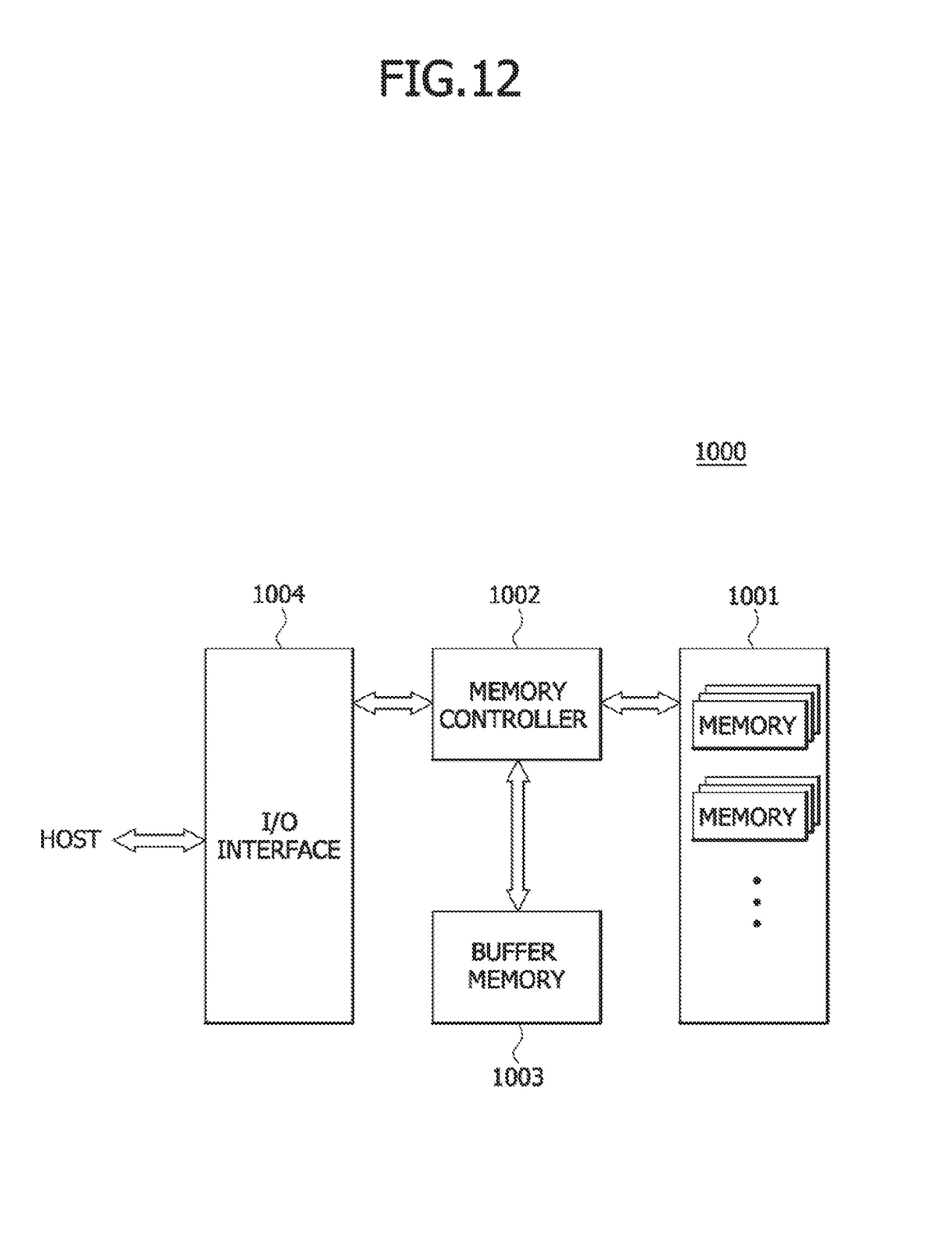
FIG. 12 is a block diagram illustrating a configuration of an electronic system employing the semiconductor device described with reference to FIGS. 1 to 11.

The semiconductor devices described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include a semiconductor device illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a code comparison circuit configured to compare a synthesis code with a selection control code to generate a comparison signal based on a comparison/control signal; and
a buffer inactivation signal generation circuit configured to output the comparison signal as a buffer inactivation signal in synchronization with an input and output (input/output) (I/O) control signal, wherein the buffer inactivation signal controls input of a data strobe signal.

2. The semiconductor device of claim 1,
wherein the comparison/control signal has a level that changes at a point of time that is set according to latency information when a first command or a second command is performed.

3. The semiconductor device of claim 2,
wherein the first command corresponds to a first write operation, and
wherein the first write operation is performed without a preamble period.

4. The semiconductor device of claim 2,
wherein the second command corresponds to a second write operation, and
wherein the second write operation is performed with a preamble period.

5. The semiconductor device of claim 1, wherein the buffer inactivation signal is enabled when a logic level combination of the synthesis code is a same logic level combination as a logic level combination of bits of the selection control code corresponding to the synthesis code.

6. The semiconductor device of claim 1,
wherein the I/O control signal includes a first I/O control signal and a second I/O control signal; and
wherein the buffer inactivation signal generation circuit is configured to output the comparison signal as the buffer inactivation signal in synchronization with the first I/O control signal and is configured to output the comparison signal as the buffer inactivation signal in synchronization with the second I/O control signal.

7. The semiconductor device of claim 1, further comprising
a period code generation circuit configured to generate a period code having a logic level combination corresponding to a first command or a second command; and
a code synthesis circuit configured to add the period code to a previous synthesis code to generate the synthesis code.

8. The semiconductor device of claim 1, further comprising a code selection circuit configured to output a first control code or a second control code as the selection control code based on the synthesis code.

9. The semiconductor device of claim 8, wherein the first control code is counted when a first I/O control signal is toggled, and the second control code is counted when a second I/O control signal is toggled.

10. The semiconductor device of claim 9, wherein the first I/O control signal and the second I/O control signal are generated by dividing an internal data strobe signal which is generated by buffering the data strobe signal.

11. The semiconductor device of claim 1, further comprising an input buffer circuit configured to receive the data strobe signal to generate an internal data strobe signal, based on the buffer inactivation signal.

12. The semiconductor device of claim 1, further comprising
a division circuit configured to divide an internal data strobe signal generated by buffering the data strobe signal to generate a first I/O control signal and a second I/O control signal; and
a control code generation circuit configured to count the first control code based on the first I/O control signal and configured to count the second control code based on the second I/O control signal.

* * * * *